US006667703B1

United States Patent
Reuveni et al.

(10) Patent No.: US 6,667,703 B1
(45) Date of Patent: Dec. 23, 2003

(54) MATCHING CALIBRATION FOR DIGITAL-TO-ANALOG CONVERTERS

(75) Inventors: David R. Reuveni, Taufkirchen (DE); Stefan G. Block, Munich (DE)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/232,968

(22) Filed: Aug. 30, 2002

(51) Int. Cl.[7] ............................. H03M 1/10; H03M 1/06
(52) U.S. Cl. ................................. 341/120; 341/118
(58) Field of Search .................................. 341/118, 120, 341/136, 145, 144; 702/107; 324/74

(56) References Cited

U.S. PATENT DOCUMENTS

| 4,222,107 A | * | 9/1980 | Mrozowski et al. ........ 702/107 |
| 5,121,119 A | * | 6/1992 | Higuchi et al. ............ 341/120 |
| 5,184,062 A | * | 2/1993 | Ladwig ..................... 324/74 |
| 5,517,191 A | * | 5/1996 | Wynne ....................... 341/118 |
| 6,351,228 B1 | * | 2/2002 | Kutsuno et al. ............ 341/120 |
| 6,489,905 B1 | * | 12/2002 | Lee et al. ................... 341/120 |
| 6,556,154 B1 | * | 4/2003 | Gorecki et al. ............ 341/118 |

* cited by examiner

Primary Examiner—Patrick Wamsley
(74) Attorney, Agent, or Firm—Westman, Champlin & Kelly

(57) ABSTRACT

A method and apparatus are provided for calibrating first and second digital-to-analog converters (DACs). The apparatus has a normal input and a test input. A first correction circuit selectively modifies either the normal input or the test input by a first gain correction value and a first offset correction value to produce a first corrected value. A second correction circuit selectively modifies either the normal input or the test input by a second gain correction value and a second offset correction value to produce a second corrected value. A first DAC operates on the first corrected output and has a first analog output. A second DAC operates on the second corrected output and has a second analog output. A calibration control circuit has first and second inputs coupled to the first and second analog outputs, respectively, and generates the first and second gain correction values and the first and second offset correction values as a function of the first and second analog outputs.

16 Claims, 2 Drawing Sheets

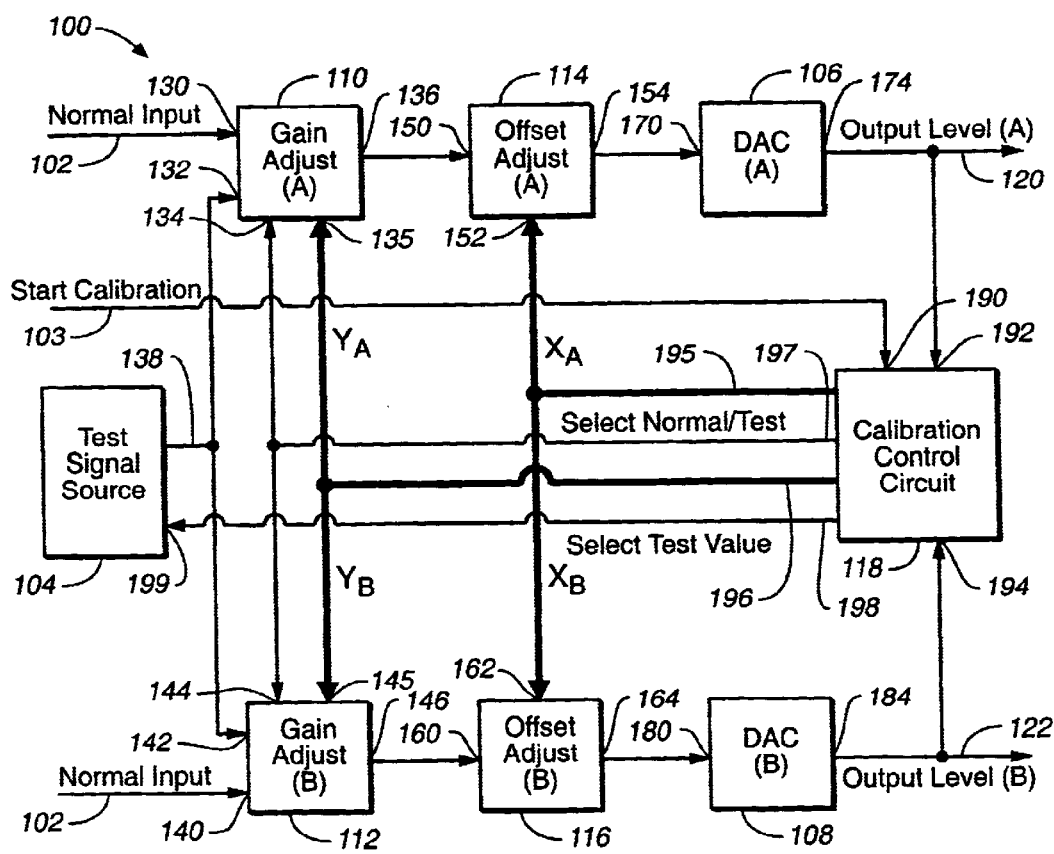
FIG._1

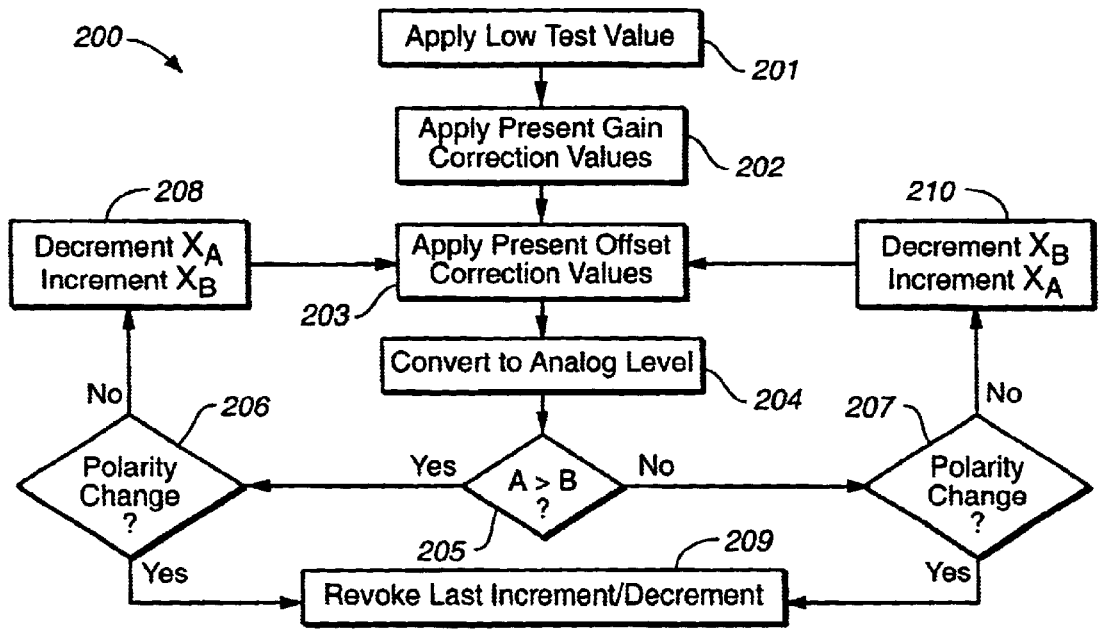
FIG._2
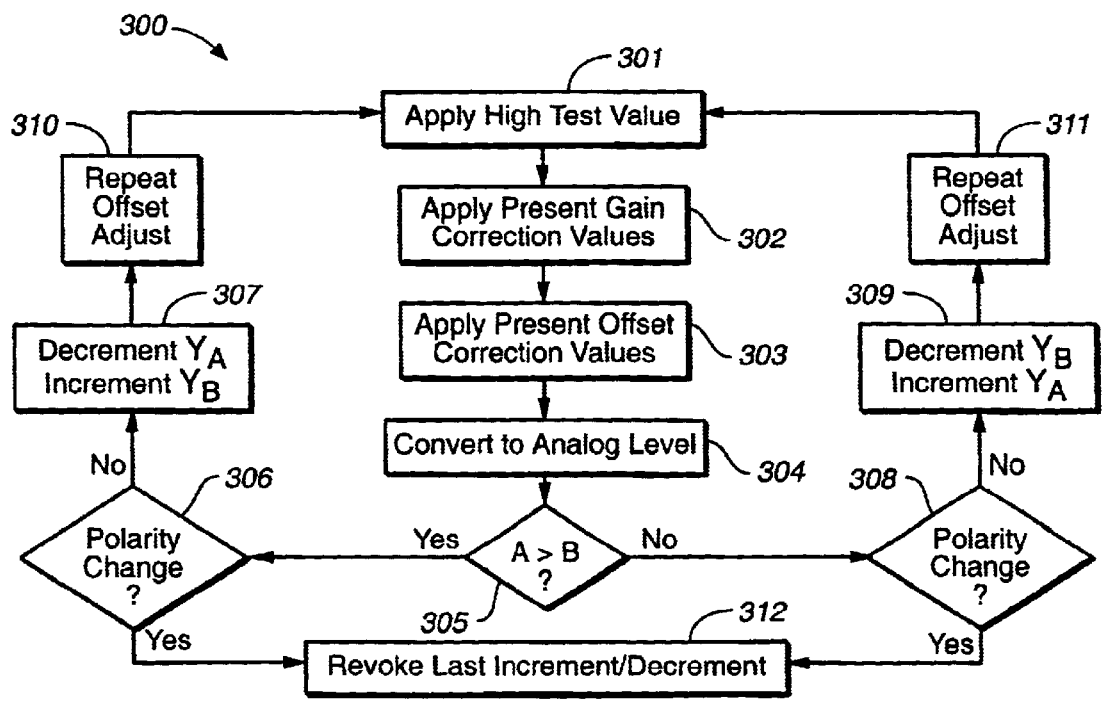
FIG._3

(12)  United States Patent US 6,667,703 B1

MATCHING CALIBRATION FOR DIGITAL-TO-ANALOG CONVERTERS

BACKGROUND OF THE INVENTION

The present invention relates to the conversion of digital values to analog signals and, more specifically to a calibration technique for matching the gain and offset characteristics of two or more digital-to-analog converters of the same type.

Digital-to-analog converters (DACs) are used in a wide range of applications. In some applications, two or more DACs are used in parallel with one another. In these applications, it is desirable for the gain and offset characteristics of each DAC to be the same as the characteristics of the other DAC.

Two or more matched DACs are used in applications where two or more channels of digital data need to be converted into matched analog output levels. For example, matched DACs can be used to generate quadrature signals for satellite and terrestrial data communication systems. Each DAC preferably generates the same output level for a given digital input value. Any gain and offset differences between DACs in these systems can cause data communication errors.

A technique is therefore desired for calibrating multiple DACs simultaneously such that they have similar gain and offset characteristics.

SUMMARY OF THE INVENTION

One embodiment of the present invention is directed to a method for calibrating first and second digital-to-analog converters (DACs). According to the method, a first test value is applied to a test input. The test input is modified by a first correction value to produce a first corrected value, and the test input is modified by a second correction value to produce a second corrected value. The first and second corrected values are applied to first and second DACs, respectively to produce first and second corrected analog outputs. At least one of the first and second correction values is adjusted relative to the other as a function of the first and second corrected analog outputs.

Another embodiment of the present invention is directed to a DAC converter system, which has a normal input and a test input. A first correction circuit selectively modifies either the normal input or the test input by a first gain correction value and a first offset correction value to produce a first corrected value. A second correction circuit selectively modifies either the normal input or the test input by a second gain correction value and a second offset correction value to produce a second corrected value. A first DAC operates on the first corrected output and has a first analog output. A second DAC operates on the second corrected output and has a second analog output. A calibration control circuit has first and second inputs coupled to the first and second analog outputs, respectively, and generates the first and second gain correction values and the first and second offset correction values as a function of the first and second analog outputs.

Yet another embodiment of the present invention is directed to a multiple digital-to-analog converter (DAC) system. The system includes a normal input and a test input. A first set of offset and gain correction values are applied to either the digital normal input or the digital test input to produce a first corrected value. A second set of offset and gain correction values are applied to either the digital normal input or the digital test input to produce a second corrected value. First and second DACs operate on the first and second corrected values, respectively, and have first and second analog outputs, respectively. A digital value is applied to the test input, and at least one of the first and second offset correction values is repetitively adjusted relative to the other as a function of the first and second analog outputs. A second digital value, which is different than the first digital value, is applied to the digital test input and at least one of the first and second gain correction values is repetitively adjusted relative to the other as a function of the first and second analog outputs.

BRIEF DESCRIPTION OF THE DRAWINGS

FIG. 1 is a block diagram of a multiple digital-to-analog converter (DAC) system according to one embodiment of the present invention.

FIG. 2 is a flowchart illustrating an offset adjustment process for the system shown in FIG. 1 according to one embodiment of the present invention.

FIG. 3 is a flowchart illustrating a gain adjustment process for the system shown in FIG. 1 according to one embodiment of the present invention.

DETAILED DESCRIPTION OF ILLUSTRATIVE EMBODIMENTS

FIG. 1 illustrates a digital-to-analog converter (DAC) system 100 according to one embodiment of the present invention. System 100 includes digital normal inputs 102, a start calibration input 103, a test signal source 104, DACs 106, and 108 (units "A" and "B"), gain adjust circuits 110 and 112, offset adjust circuits 114 and 116, calibration control circuit 118 and corrected outputs 120 and 122. Normal input 102 can include a respective digital input for each gain adjust circuit 110 and 112 or a single digital input.

Gain adjust circuit 110 has multiplexed digital inputs 130 and 132, a mode select input 134, a gain correction input 135 and a gain corrected output 136. Digital input 130 is coupled to normal input 102, and digital input 132 is coupled to a test signal output 138 of test signal source 104. Mode select input 134 is coupled to receive a mode select signal from calibration control circuit 118, and gain correction input 135 is coupled to receive a gain correction value $Y_A$ from calibration control circuit 118.

Similarly, gain adjust circuit 112 has multiplexed digital inputs 140 and 142, a mode select input 144, a gain correction input 145 and a gain corrected output 146. Digital input 140 is coupled to normal input 102, and digital input 142 is coupled to test signal output 138 of test signal source 104. Mode select input 144 is coupled to receive the mode select signal from calibration control circuit 118, and gain correction input 145 is coupled to receive a gain correction value $Y_B$ from calibration control circuit 118.

When system 100 is in a normal operating mode, the mode select signal applied to select inputs 134 and 144 causes the gain correction values $Y_A$ and $Y_B$ to operate on the normal digital values received on inputs 130 and 140 to generate gain corrected values on outputs 136 and 146, respectively. When system 100 is in a test or calibration mode, the mode select signal applied to select inputs 134 and 144 causes the gain correction values $Y_A$ and $Y_B$ to operate on the test value on inputs 132 and 142 to generate gain corrected test values on outputs 136 and 146, respectively.

In one embodiment, gain adjust circuits 110 and 112 each include a digital multiplier, which multiplies the digital values received on inputs 130,140 or 132,142 by the gain correction values received on inputs 135 and 145 from calibration control circuit 118. The gain correction values are used to compensate for any differences in gain between DACs 106 and 108. In one embodiment, the digital input values received on inputs 130,140 and 132,142 are considered to be unsigned binary numbers, and the gain correction values received on inputs 135 and 145 are considered to be scaled binary numbers, which represent values between 0 and 2.0 for example. Other digital formats and ranges can also be used.

Offset adjust circuit 114 has an input 150, which is coupled to gain corrected output 136, and an offset correction input 152, which is coupled to receive an offset correction value $X_A$ from calibration control circuit 118. Offset adjust circuit 114 receives the gain corrected output 136 from gain adjust circuit 110 and applies the offset correction value $X_A$ to produce a gain and offset corrected output value on output 154.

Similarly, offset adjust circuit 116 has an input 160, which is coupled to gain corrected output 146, and an offset correction input 162, which is coupled to receive an offset correction value $X_B$ from calibration control circuit 118. Offset adjust circuit 116 applies the offset correction value to the gain corrected output 146 to produce a gain and offset corrected output value on output 164. The offset correction values are used to compensate for any differences in offset characteristics between DACs 106 and 108.

In one embodiment, offset adjust circuits 114 and 116 each include a digital adder, which adds the respective offset correction values received on inputs 152 and 162 to gain corrected outputs 136 and 146. In one embodiment the offset correction values are scaled signed binary values ranging from −1.0 to +1.0. Other ranges can also be used. The result of this addition becomes the respective gain and offset corrected output values on outputs 154 and 164.

Outputs 154 and 164 are coupled to inputs 170 and 180, respectively, of DACs 106 and 108. DACs 106 and 108 convert the gain and offset corrected values on outputs 154 and 164 into analog signal levels on analog outputs 174 and 184, respectively, which are labeled "Output Level(A)" and "Output Level(B)". Output 174 is coupled to corrected output 120, and output 184 is coupled to corrected output 122. Any type of DAC converter can be used in accordance with the present invention. Corrected outputs 120 and 122 can each be single-ended or differential, for example.

Calibration control circuit 118 has an enable input 190, which is coupled to start calibration input 103, and comparison inputs 192 and 194, which are coupled to corrected outputs 120 and 122, respectively. Calibration control circuit 118 has an offset correction output 195, a gain correction output 196, a normal/test select output 197 and a test signal control output 198. Offset correction output 195 is coupled to offset correction inputs 152 and 162 of offset adjust circuits 114 and 116. Gain correction output 196 is coupled to gain correction inputs 135 and 145 of gain adjust circuits 110 and 112. Normal/test select output 197 is coupled to select inputs 134 and 144 of gain adjust circuits 110 and 112. Test signal select output 198 is coupled to select input 199 of test signal source 104.

In one embodiment, calibration control circuit 118 is implemented as a state machine in which the outputs 195, 196, 197 and 198 are functions of the inputs to the state machine and the current state of the machine. However, the function performed by calibration control circuit 118 can be performed by any suitable circuit in alternative embodiments of the present invention. For example, calibration control circuit 118 can include a programmed computer, a microprocessor, or any other circuit that is controlled by hardware, software or a combination of both hardware and software.

During normal operation, start calibration input 103 has an inactive state. When this input is inactive, calibration control circuit 118 sets normal/test select output 197 to the normal state, which causes gain adjust circuits 110 and 112 and offset adjust circuits 114 and 116 to operate on the digital values applied to normal inputs 102 based on the present gain correction values $Y_A$ and $Y_B$ and the present offset correction values $X_A$ and $X_B$. In one embodiment, calibration control circuit 118 includes a register for storing each of the gain correction values $Y_A$ and $Y_B$ and each of the offset correction values $X_A$ and $X_B$. DACs 106 and 108 then convert the gain and offset corrected values to analog levels on outputs 120 and 122. Output Level(A) and Output Level(B) are therefore corrected for mismatches in gain and offset between the DACs.

When start calibration input 103 is in the active state, calibration control circuit 118 begins a routine for calibrating the values of $Y_A$, $Y_B$, $X_A$ and $X_B$ such that Output Level(A) is approximately equal to Output Level (B). Start calibration input 103 can be activated at any suitable time, such as when system 100 is powered-up, when system 100 is idle or at regularly planned intervals. Calibration control circuit 118 sets normal/test select output 197 to the test mode so that gain adjust circuits 110 and 112 and offset adjust circuits 114 and 116 operate on the digital test value provided by test signal source 104 on output 138.

In one embodiment, the digital test value is selectable by calibration control circuit 118 through test signal select input 199. For example, the test value can be forced to a relatively low value or a relatively high value, depending on the state of select input 199. Test signal source 104 can include any suitable type of digital signal source, which may depend on the environment in which the circuit is implemented. Alternatively, the test values can be generated from an off-chip source.

Calibration control circuit 118 controls test signal source 104 to sequentially apply the low and high values to both gain adjust circuits 110 and 112 during different phases of the calibration sequence. In each phase, the converted results on outputs 120 and 122 are compared to one another by calibration control circuit 118. Calibration control circuit 118 can have any suitable circuit for comparing corrected outputs 120 and 122. For example, an analog comparator can be used, with its output being converted to a digital state that can be interpreted by circuit 118. Alternatively, each corrected output 120 and 122 can be sampled and converted to a digital value by an analog-to-digital converter (ADC). The converted digital values can then be compared to one another in the digital domain. Any suitable ADC can be used. For example, one embodiment of the present invention uses one or both of the matched ADCs disclosed in U.S. application Ser. No. 10/217,051, filed Aug. 12, 2002, and entitled "MATCHING CALIBRATION FOR DUAL ANALOG-TO-DIGITAL CONVERTERS," which is hereby incorporated by reference. Other ADCs can also be used for acquiring the analog outputs.

In one embodiment, when the low test signal is applied the difference between Output Level(A) and Output Level (B) represents a mismatch in the offset characteristics of DACs 106 and 108. Also in one embodiment, when the high test signal is applied the difference between Output Level(A)

and Output Level(B) represents a mismatch in the gain characteristics of DACs 106 and 108. Calibration control circuit 118 adjusts the results of both conversions in parallel through gain adjust circuits 110 and 112 and offset adjust circuits 114 and 116 while solving the following equation for both units:

Output Level=Converter Value*Gain Correction Value)+Offset Correction Value      EQ.1

During the calibration mode when test signal source 104 generates the low test signal, assume for example that an offset mismatch exists such that the converter output 174 of DAC 106 is greater than the converter output 184 of DAC 108. In this case, the offset correction will follow the following equations:

Output Level(A)=(Converter Value(A)*Gain Correction($Y_A$))+Offset Correction($X_A$=−x)      EQ.2

Output Level(B)=(Converter Value(B)*Gain Correction($Y_B$))+Offset Correction($X_B$=+x)      EQ.3

In Equations 2 and 3, the gain correction value is initially assumed to be 1.0 for both units, and the offset correction values $X_A$ and $X_B$ are adjusted to correct the offset mismatch. Since in this example DAC output 174 is initially greater than DAC output 184, offset adjust circuit 114 receives a negative offset correction value $X_A$=−x, and gain adjust circuit 116 receives a positive correction value $X_B$=+x, where "x" is any scaled binary value. In one embodiment, the value "x" can range from −1.0 to +1.0. Other ranges can also be used.

When test signal source 104 generates the high test signal, if we assume DAC 106 provides a smaller range of converter values on DAC output 174 than DAC 108 provides on DAC output 184, Equations 2 and 3 become:

Output Level(A)=(Converter Value(A)*Gain Correction($Y_A$=1+y))+Offset Correction($X_A$)      EQ.4

Output Level(B)=(Converter Value(B)*Gain Correction($Y_B$=1−y))+Offset Correction($X_B$)      EQ.5 where "y" is a scaled binary number variable that contains a cumulative correction for $Y_A$ and $Y_B$, and the offset is assumed to be zero for both units. In an actual circuit, the gain correction factors (1+y) and (1−y) are not really complementary. The difference between the resulting values and the ideal values is small for small values y and will normally be insignificant and absorbed in the offset calibration or in the resolution of the correction factors.

Complementary gains values are such that $Y_A * 1/Y_B = 1$. This relation is not precisely equivalent in actual embodiments that implement Equations 4 and 5. For example, assume that the factor y=0.2. In a complementary system, one corrective factor $Y_A$ or $Y_B$ becomes 0.8 and the other should be 1.25 in order to fulfill the $Y_A * 1/Y_B = 1$ equation. In embodiments implementing Equations 4 and 5, one corrective factor $Y_A$ or $Y_B$ becomes 0.8 and the other becomes 1.2 such that 0.8*1.2=0.96, resulting in some loss in overall gain. Thus the correction factors are not really complementary. However in a typical application, two DACs on the same chip will have a smaller degree of error between them than two randomly selected DACs on different chips. For a small error between DACs, the corrective factor is small resulting in a very small loss in overall gain. For example, for an error of 1% the corrective factors are 0.99 and 1.01 with an overall gain of 0.9999.

With the system of equations shown in Equations 2–5, the difference between the converter outputs of DACs 106 and 108 is halved and then applied to both units in such a manner that the final, corrected output values on outputs 120 and 122 are substantially equal. In one embodiment, calibration control circuit 118 employs a simple iterative approach to achieve convergence of Output Level(A) and Output Level (B) rather than attempting to directly solve the difference equations and applying the results to both units.

FIG. 2 is a flow chart illustrating an offset adjust process 200 performed by calibration control circuit 118 according to one embodiment of the present invention. At step 201, calibration control circuit 118 controls test signal source 104 to apply the low digital test value and places gain adjust circuits 110 and 112 in the test mode by switching the inputs to receive the test value. At step 202, the present gain correction values $Y_A$ and $Y_B$ are applied to the low test value by gain adjust circuits 110 and 112. During the first pass through the overall calibration process loop, the gain correction values $Y_A$ and $Y_B$ are initialized to "1.0", for example. At step 203, the present offset correction values $X_A$ and $X_B$ are applied to the corrected gain outputs 136 and 146 by offset adjust circuits 114 and 116. The offset correction values $X_A$ and $X_B$ are initialized to "0". At step 204, DACs 106 and 108 convert the resulting gain and offset corrected output values on outputs 154 and 164 to analog signal levels, which are applied to outputs 120 and 122.

At step 205, calibration control circuit 118 compares the corrected output levels, Output Level(A) and Output Level (B). If Output Level(A) is greater than Output Level(B), calibration control circuit 118 determines, at step 206, whether the present iteration of loop 200 caused a change in the relative magnitudes of Output Level(A) and Output Level(B) as compared to the previous iteration. Similarly, if Output Level(A) is less than Output Level(B), calibration control circuit 118 determines, at step 207, whether the present iteration of loop 200 caused a change in the relative magnitudes of Output Level(A) and output Level(B).

Calibration control circuit 118 monitors the relative magnitudes of Output Level(A) and Output Level (B) over successive comparisons to detect when adjustments to the offset correction values $X_A$ and $X_B$ causes one of the corrected output levels that was previously greater than (or less than) the other output level to become less than (or greater than) the other output level. This can be detected by a change in polarity at the output of the comparator that is used by circuit 118 to compare Output Level(A) and Output Level(B), for example.

The offset adjust loop proceeds either to step 208 or step 210 depending on the relative magnitudes of Output Level (A) and Output Level(B). If Output Level(A) is greater than Output Level(B), offset correction value $X_A$ is decremented by one correction unit, and offset correction value $X_B$ is incremented by one correction unit at step 208. If Output Level(A) is less than Output Level (B), offset correction value $X_B$ is decremented by one correction unit, and offset correction value $X_A$ is incremented by one correction unit at step 210. In an alternative embodiment, only one of the two correction values $X_A$ and $X_B$ is adjusted at step 208. Also, $X_A$ and $X_B$ can be adjusted by the same incremental value or by different incremental values.

Calibration control circuit 118 stores the new values of $X_A$ and $X_B$ in respective internal registers, and outputs the new values to offset adjust circuits 114 and 116, which then apply those values at 204. The resulting Output Values (A) and (B) are again compared by calibration control circuit 118 at step 205. If Output Level(A) continues to be greater than (or less than) Output Level(B) such that there has been no change in polarity of the comparison result, the offset correction values $X_A$ and $X_B$ are again adjusted at step 208 (or step 210). $X_A$ is decremented (or incremented) by another unit and $X_B$ is incremented (or decremented) by another unit. Calibration control circuit 118 again applies the new, present values of $X_A$ and $X_B$ to offset adjust circuits 114 and 118 at step 204. This process continues until the polarity of the comparison between Output Level(A) and Output Level(B) changes state. At this point, step 206 or 207 detects that there has been a change in polarity of the comparison output.

Calibration control circuit 118 then revokes the last increment/decrement of $X_A$ and $X_B$ at step 209 and applies the present values of $X_A$ and $X_B$ to offset adjust circuits 114 and 116 to complete the offset adjust loop. The last incremental correction is revoked in order to avoid constant corrections back and forth when the offset adjust loop is in a monitoring state. Since the corrections have a finite size, a change is made only when needed. A change is made when the amount of correction to be made is greater than one correction unit.

Once the offset adjust loop has completed, calibration control circuit 118 adjusts the gain correction values $Y_A$ and $Y_B$. FIG. 3 is a flow chart illustrating a gain adjustment process 300 according to one embodiment of the present invention. At step 301, calibration control circuit 118 controls test signal source 104 to generate the high test value on output 138. At step 302, gain adjust circuits 110 and 112 apply the present gain correction values $Y_A$ and $Y_B$. At step 303, calibration control circuit 118 applies the present offset correction values $X_A$ and $X_B$, as previously adjusted by offset adjustment loop 200, through offset adjust circuits 114 and 116. At step 304, DACs 106 and 108 convert the gain and offset corrected digital values on outputs 154 and 164 to analog signal levels on outputs 120 and 122.

At step 305, calibration control circuit compares Output Level (A) with Output Level (B). If Output Level(A) is greater than Output Level(B) and if the present iteration through loop 300 did not cause a change in the comparison polarity, as detected at step 306, calibration control circuit decrements gain correction value $Y_A$ and increments gain correction value $Y_B$ at step 307. Similarly, if Output Level (B) is greater than Output Level(A) and there has been no change in the comparison polarity from a previous iteration of step 305, as detected at step 308, calibration control circuit decrements $Y_B$ and increments $Y_A$, at step 309. The incremented/decremented values of $Y_A$ and $Y_B$ are stored in respective internal registers within calibration control circuit 118.

Calibration control circuit 118 then applies the newly updated gain correction values to gain adjust circuits 110 and 112. However, after each corrective step 307 or 309, calibration control circuit 118 returns to offset adjustment loop 200 to verify that the update to the gain correction values has not caused the offset between DACs 106 and 108 to change. If the offset changes, it is corrected in loop 200 before returning to gain adjust loop 300.

Offset adjustment loop 200 is therefore repeated at steps 314 and 315. Once the offset correction values $X_A$ and $X_B$ have been further corrected, if necessary, calibration control circuit 118 returns to step 301 and reapplies the high test value to gain adjust circuits 110 and 112. The present gain and offset correction values are applied at steps 302 and 303, and the corrected outputs are converted to analog levels at step 304. The analog levels are compared at step 305.

This process repeats until the initially lesser one of Output Level(A) and Output Level(B) exceeds the other one of Output Values (A) and (B). This change in relative magnitude is detected at step 306 or 308, and the last increment/decrement of $Y_A$ and $Y_B$ that caused the change is revoked at step 312.

In this manner, both the gain correction values and the offset correction values are adjusted until the corrected outputs are the same for both the high and low test values. When the calibration sequence is complete, calibration control circuit 118 sets a status bit. A host system can monitor this status bit to detect when the calibration sequence is complete. The host system can also monitor the current values of the gain and offset correction registers of both DACs.

The choice of digital values for the high and low test signals can change depending on the particular application in which the circuit is used. For example, the low test value can be set to ¼ of the input range of DACs 106 and 108, and the high test value can be set at approximately ¾ of the input range. These settings provide enough headroom at both ends of the input range to adjust the results without limiting the output values. A choice of low and high signal values that are closer to the extremes of the DAC input range may cause limiting within the DACs themselves and also within the gain or offset adjustment circuits. The absolute values of the low and high test values are unimportant. They should be quite different from one another but do not need to have any particular value. Also, the test signal could be high or low for either gain or offset correction.

The calibration sequence shown in FIGS. 2 and 3 can be initiated by a start signal at anytime. In this sense, each calibration sequence is independent of previous calibration sequences. The only difference between the first all following calibration sequences is that a following calibration sequence may start without resetting the offset and gain correction values from its predecessor. However, this is a system level decision, and the calibration values may be reset at any time.

In an alternative embodiment, the gain and offset correction values are fully adjusted, rather than incrementally adjusted, with each pass through the gain and offset adjustment loops. In this alternative embodiment, calibration control circuit 118 solves the appropriate difference equations, such as EQS. 2 and 3 or EQS. 4 and 5, with each pass through the offset or gain adjustment loops. The resulting offset correction and gain correction are then each applied to one DAC unit or split or otherwise portioned and applied to both DAC units such that the corrected outputs from both units are substantially the same. In another alternative embodiment, calibration control circuit 118 uses a successive approximation technique through a sequence of steps that are performed for each calibration.

In yet another alternative embodiment, the outputs from each DAC being calibrated are digitized and processed to provide both offset and gain correction values by solving a few equations (rather than by a comparison). In many circuits that require matched performance of DACs, ADCs are also present. Although the ADCs can be matched in a similar fashion, only one of the ADCs would be used to measure the outputs of both DACs to ensure that no additional errors from the ADCs are introduced into the correction factors.

By using this approach, the ADC can acquire two (or more) sets of output values for two (or more) DACs that are being matched. One set would be acquired while the test signal source is set to the low value, and the other set would be acquired while the test signal source is set to the high value. The two (or more) sets of output values provide much more information than a simple comparison.

Using the notation that the resulting digitized output values of DACs 106 and 108 are "Output Value(A,$T_H$)" and "Output Value(B,$T_H$)" for a high test signal level, $T_H$, (gain adjustment) and are "Output Value(A,$T_L$)" and "Output Value(B,$T_L$)" for a low test signal level, $T_L$, (offset adjustment), several equations can be written.

The midpoints between output values produced for the low and high test values for the DACs are, $$\text{Midpoint}(A) = (\text{Output Value}(A,T_H) + \text{Output Value}(A,T_L))/2 \quad \text{EQ. 6}$$

$$\text{Midpoint}(B) = (\text{Output Value}(B,T_H) + \text{Output Value}(B,T_L))/2 \quad \text{EQ. 7}$$

Assuming for example that Output Value(B) is greater than Output Value(A), the offset correction values $X_A$ and $X_B$ can be calculated from, $$X_A = (\text{old})X_A + (\text{Midpoint}(A) - \text{Midpoint}(B))/2 \quad \text{EQ. 8}$$

$$X_B = (\text{old})X_B - (\text{Midpoint}(A) - \text{Midpoint}(B))/2 \quad \text{EQ. 9}$$

The gains of units A and B between the low and high test values are, $$\text{Gain}(A) = \text{Output Value}(A,T_H) - \text{Output Value}(A,T_L) \quad \text{EQ. 10}$$

$$\text{Gain}(B) = \text{Output Value}(B,T_H) - \text{Output Value}(B,T_L) \quad \text{EQ. 11}$$

Gain correction values $Y_A$ and $Y_B$ can therefore be calculated by, $$Y_A = (\text{old})Y_A + (\text{Gain}(A) - \text{Gain}(B))/2 \quad \text{EQ. 12}$$

$$Y_B = (\text{old})Y_B - (\text{Gain}(A) - \text{Gain}(B))/2 \quad \text{EQ. 13}$$

With this approach, it is also possible to generate complementary values for the gain correction values. The gain factor can be calculated as, $$Y_A = (\text{old})Y_A * \text{Gain}(A)/\text{Gain}(B) \quad \text{EQ. 14}$$

$$Y_B = (\text{old})Y_B * \text{Gain}(B)/\text{Gain}(A) \quad \text{EQ. 15}$$

Although some linearity issues could be encountered, a second set of readings from both DACs would provide new, smaller correction factors which would contain less error potential. After a second correction, the residual error should be very small.

In addition, the test signal source can be configured to generate a digital ramp or sine wave, which can be selected and used by control circuit 118 to verify the integral and differential linearity of both DACs and compare the results over the whole operating range.

Although the present invention has been described with reference to preferred embodiments, workers skilled in the art will recognize that changes may be made in form and detail without departing from the spirit and scope of the invention. For example, the order in which the gain and offset adjust circuits are coupled to the inputs of the DACs can be reversed. Also, the order in which the correction values are calibrated can be reversed in alternative embodiments of the present invention. The particular calibration sequences shown in FIGS. 2 and 3 can be modified as desired. Also, any number of multiple DACs can be calibrated in a similar fashion. Other changes can also be made.

What is claimed is:

1. A method of calibrating first and second digital-to-analog converters (DACs), the method comprising:
   a) applying a first test value to a test input;
   b) modifying the test input by a first correction value to produce a first corrected value;
   c) modifying the test input by a second correction value to produce a second corrected value;
   d) applying the first and second corrected values to first and second DACs, respectively to produce first and second corrected analog outputs; and
   e) adjusting at least one of the first and second correction values relative to the other as a function of the first and second corrected analog outputs.

2. The method of claim 1 wherein the first and second correction values comprise first and second offset correction values, respectively, and wherein:
   step b) comprises adding the first offset correction value to the test input to produce a first offset corrected value; and
   step c) comprises adding the second offset correction value to the test input to produce a second offset corrected value.

3. The method of claim 2 and further comprising:
   f) applying a second test value to the test input, which is greater than the first test value;
   g) modifying the test input by a first gain correction value to produce a first gain corrected value;
   h) modifying the test input by a second gain correction value to produce a second gain corrected value;
   i) applying the first and second gain corrected values to the first and second DACs, respectively to produce first and second gain corrected analog outputs;
   j) comparing the first and second gain corrected analog outputs while applying the second test signal in step f) to identify a greater one and a lesser one of the first and second gain corrected analog outputs;
   k) adjusting at least one of the first and second gain correction values relative to the other; and
   l) after step k), repeating steps g) through k) until the first or second gain corrected analog output that was identified in step j) as the lesser one exceeds the other.

4. The method of claim 3 wherein:
   step b) comprises adding the first offset correction value to the first gain corrected value to produce a first gain and offset corrected value;
   step c) comprises applying the second offset correction value to the second gain corrected value to produce a second gain and offset corrected value; and
   steps d) and i) comprise applying the first and second gain and offset corrected values to the first and second DACs, respectively, to produce first and second gain and offset corrected analog outputs;
   step e) comprises comparing the first and second gain and offset corrected analog outputs while applying the first test signal in step a) to identify a greater one and a lesser one of the first and second gain and offset corrected analog outputs.

5. The method of claim 4 wherein steps a) through e) are performed in an offset adjustment loop and steps f) through l) are performed in a gain adjustment loop and wherein the gain adjustment loop further comprises:
   m) repeating the offset adjustment loop after adjusting at least one of the first and second gain correction values relative to the other in step k) of the gain adjustment loop.

6. The method of claim 5 wherein step m) comprises repeating the offset adjustment loop only if a most recent adjustment performed in step k) when, during a present iteration of step j), the adjustment results in the lesser gain and offset corrected analog output identified in a previous iteration of step j) remaining less than the greater gain and offset corrected analog output identified in the previous iteration of step j).

7. The method of claim 3 and further comprising: m) revoking a most recent adjustment performed in step k) when, during a present iteration of step j), the adjustment results in the lesser gain corrected analog output identified in a previous iteration of step j) exceeding the other gain corrected analog output identified in the previous iteration of step j).

8. The method of claim 1 and further comprising:
   f) comparing the first and second corrected analog outputs to identify a greater one and a lesser one of the first and second corrected analog outputs; and
   g) after step f), repeating steps b) through f) until the first or second corrected analog output that was identified as the lesser one exceeds the other.

9. The method of claim 8 wherein step f) comprises:
   f) 1) incrementing the respective first or second correction value of the lesser corrected analog output; and
   f) 2) decrementing the respective first or second correction value of the other corrected analog output.

10. The method of claim 9 and further comprising:
    h) revoking a most recent adjustment performed in step f) when, during a present iteration of step e), the adjustment results in the lesser corrected analog output identified in a previous iteration of step e) exceeding the other corrected analog output identified in the previous iteration of step e).

11. The method of claim 1 wherein the first and second correction values comprise first and second gain correction values, respectively, and wherein:
    step b) comprises multiplying the first test value by the first gain correction value to produce a first gain corrected value; and
    step c) comprises multiplying the first test value by the second gain correction value to produce a second gain corrected value.

12. A digital-to-analog converter (DAC) system comprising:
    a digital normal input;
    a digital test input;
    a first correction circuit adapted to modify selectively either the digital normal input or the digital test input by a first gain correction value and a first offset correction value to produce a first corrected value;
    a second correction circuit adapted to modify selectively either the digital normal input or the digital test input by a second gain correction value and a second offset correction value to produce a second corrected value;
    a first DAC which operates on the first corrected output and has a first analog output;
    a second DAC which operates on the second corrected output and has a second analog output; and
    a calibration control circuit having first and second inputs coupled to the first and second analog outputs, respectively, and generating the first and second gain correction values and the first and second offset correction values as a function of the first and second analog outputs.

13. The DAC system of claim 12 wherein the calibration control circuit comprises means for:
    a) applying a first test value to the digital test input and controlling the first and second correction circuits to operate on the digital test input;
    b) applying the first offset correction value to the first correction circuit to produce the first corrected value;
    c) applying the second offset correction value to the second correction circuit to produce the second corrected value;
    d) comparing the first and second analog outputs while applying the first test value in step a) to identify a greater one and a lesser one of the first and second analog outputs;
    e) adjusting at least one of the first and second offset correction values relative to the other; and
    f) after step e), repeating steps b) through e) until in a present iteration of step d) the lesser analog output identified in a previous iteration of step d) exceeds the greater analog output identified in the previous iteration of step d).

14. The DAC system of claim 13 wherein the calibration control circuit further comprises means for:
    g) applying a second test value, which is different than the first test value, to the digital test input and controlling the first and second correction circuits to operate on the digital test input;
    h) applying the first gain correction value to the first correction circuit to produce the first corrected value;
    i) applying the second gain correction value to the second correction circuit to produce the second corrected value;
    j) comparing the first and second analog outputs while applying) the second test value in step g) to identify a greater one and a lesser one of the first and second analog outputs;
    k) adjusting at least one of the first and second gain correction values relative to the other; and
    l) after step k), repeating steps h) through k) until in a present iteration of step j) the lesser analog output identified in a previous iteration of step j) exceeds the greater analog output identified in the previous iteration of step j).

15. The DAC system of claim 12 wherein:
    the first correction circuit comprises a first gain adjust circuit coupled to the digital normal input and the digital test input, and a first offset adjust circuit coupled to an output of the first gain adjust circuit; and
    the second correction circuit comprises a second gain adjust circuit coupled to the digital normal input and the digital test input, and a second offset adjust circuit coupled to an output of the second gain adjust circuit.

16. A multiple digital-to-analog converter (DAC) system comprising:
    a digital normal input;
    a digital test input;
    means for applying first offset and gain correction values to either the digital normal input or the digital test input to produce a first corrected value, and for applying second offset and gain correction values to either the digital normal input or the digital test input to produce a second corrected value;
    first and second DACs which operate on the first and second corrected values, respectively, and have first and second analog outputs, respectively;
    means for applying a first digital value to the digital test input and repetitively adjusting at least one of the first and second offset correction values relative to the other as a function of the first and second analog outputs; and
    means for applying a second digital value, which is different than the first digital value, to the digital test input and repetitively adjusting at least one of the first and second gain correction values relative to the other as a function of the first and second analog outputs.

* * * * *